United States Patent [19]

Hironaka

[11] Patent Number: 5,231,302
[45] Date of Patent: Jul. 27, 1993

[54] SEMICONDUCTOR DEVICE INCLUDING AN OBLIQUE SURFACE AND AN ELECTRODE CROSSING THE OBLIQUE SURFACE

[75] Inventor: Misao Hironaka, Itami, Japan

[73] Assignee: Mitsubishi Denki Kabushiki Kaisha, Tokyo, Japan

[21] Appl. No.: 792,935

[22] Filed: Nov. 15, 1991

[30] Foreign Application Priority Data

Jan. 8, 1991 [JP] Japan .................................... 3-566

[51] Int. Cl.$^5$ ..................... H01L 29/04; H01L 23/48; H01L 29/161
[52] U.S. Cl. .................... 257/624; 257/627; 257/739; 257/745; 257/773; 257/776
[58] Field of Search .................. 357/60, 65, 55, 61; 257/624, 627, 739, 745, 773, 776

[56] References Cited

U.S. PATENT DOCUMENTS

| | | | |
|---|---|---|---|
| 3,765,969 | 10/1973 | Kragness et al. | 357/60 |
| 3,920,492 | 11/1975 | Sugita et al. | 357/60 |
| 4,079,507 | 3/1978 | King | 357/60 |
| 4,438,448 | 3/1984 | Harrington et al. | 357/60 |
| 5,065,200 | 11/1991 | Bhat et al. | 357/60 |
| 5,151,764 | 9/1992 | Suzuki | 357/60 |

OTHER PUBLICATIONS

MacFadyen, "On The Preferential Etching Of GaAs By $H_2SO_4$–$H_2O_2$–$H_2O$", Journal of the Electrochemical Society, vol. 130, No. 9, Sep. 1983, pp. 1934–1941.
Adachi et al, "Chemical Etching Characteristics of (001) GaAs", Journal of the Electrochemical Society, vol. 130, No. 12, Dec. 1983, pp. 2427–2435.
Huo et al, "Modified Photoresist Etch Mask Process For InP Channeled Substrate Lasers", Journal of the Electrochemical Society, vol. 136, No. 3, Mar. 1989, pp. 772–775.

*Primary Examiner*—Andrew J. James
*Assistant Examiner*—Ngan Van Ngo
*Attorney, Agent, or Firm*—Leydig, Voit & Mayer

[57] ABSTRACT

A semiconductor device is made by etching a III-V compound semiconductor layer having a (100) surface using a mask having an opening defined by edges including at least one edge along an [0$\bar{1}$1] direction of the layer so that the surface revealed by etching has a (111) orientation. An electrode is formed on the (111) surface by vacuum vapor deposition.

4 Claims, 2 Drawing Sheets

SEMICONDUCTOR DEVICE INCLUDING AN OBLIQUE SURFACE AND AN ELECTRODE CROSSING THE OBLIQUE SURFACE

The present invention relates to a semiconductor device and, more particularly, to an electrode structure of a semiconductor device and a method of making it. In the specification of this application, plane orientations are denoted by symbols, such as (001) and (111), but these symbols also denote equivalent planes, because of crystallographic symmetry. Further, zone axes are denoted by symbols, such as [001] and [0$\bar{1}$1]. These symbols also denote equivalent zone axes, because of the crystallographic symmetry.

BACKGROUND OF THE INVENTION

Some prior art semiconductor devices employ an electrode structure, such as shown in FIGS. 1 and 2. The semiconductor device shown in FIGS. 1 and 2 includes a semiconductor layer 11 of a III-V compound semiconductor, such as GaAs and InP. A semiconductor layer 12 is disposed on a major surface of the semiconductor layer 11. The plane orientation of the major surface is (100). The semiconductor layer 12 is also a III-V compound semiconductor, such as GaAs and InP and has an edge extending along the [0$\bar{1}$0] direction, as shown in FIG. 2. The orientation of the plane of the side surface 14 of the edge is (001) which is orthogonal to the major surface of the semiconductor layer 11. The semiconductor layer 12 is formed by epitaxially growing a semiconductor layer over the entire major surface of the semiconductor layer 11 and, using a mask, etching away undesired portions of the epitaxially grown semiconductor layer until the portions of the major surface of the layer 11 beneath them are revealed. An electrode 13 is disposed on both of the major surfaces of the semiconductor layers 12 and 11. The electrode 13 is formed by vacuum vapor depositing a metal onto the major surfaces of the semiconductors layers 11 and 12 from the direction perpendicular thereto, so that the electrode 13 has a step presenting a side surface 16 near the side surface 14 of the semiconductor layer 12, as shown in FIG. 2.

Because the electrode 13 is formed by vacuum vapor deposition in the direction perpendicular to the major surfaces of the semiconductor layers 11 and 12, the distance $t_s$ of the side surface 16 of the conductor electrode 13 from the extension of the side surface 14 of the semiconductor layer 12 is substantially smaller than the thickness $t_o$ of that portion of the conductor electrode 13 which lies on the major surface of the semiconductor layer 12. In an extreme situation, the distance $t_s$ may be zero and, therefore, the conductor electrode 13 may be discontinuous. One may contemplate use of a sputtering technique, instead of vacuum vapor deposition, trying to form the electrode 13 with a larger $t_s$, since, in sputtering, the mean free path of film forming particles is small and, accordingly, a relatively large number of the film forming particles tend to turn around corners. However, such film forming particles still impinge perpendicularly to the major surface of the semiconductor layers 11 and 12, and, therefore, the distance $t_s$ is only 10–20% of the thickness $t_o$. Furthermore, due to some etching conditions, poor adhesion of an etching mask used to mask the semiconductor layer 12, the orientation of the side surface 14 may sometimes be displaced from its desired (001) orientation so that the ratio $t_s/t_o$ may vary considerably depending on etching conditions. If the distance $t_s$ small, when a current I is applied to the electrode 3, since the resistance of the electrode 13 at the portion with the thickness $t_s$ is large, the Joule heat Q generated at that portion, which is expressed as $Q=I^2R$, becomes large. Ultimately, the temperature at the portion may reach the melting point of the material of the conductor electrode 13, so that part of the electrode 13 melts and becomes discontinuous.

An object of the present invention is to provide a semiconductor device with a large distance $t_s$ to avoid disconnection of parts of the electrode 13, and also a method of making such a semiconductor device.

In order to achieve the above-identified object, the semiconductor device according to the present invention comprises a layer of a III-V compound semiconductor material having a major surface in the (100) orientation, which has a side surface formed by etching the major surface. The semiconductor device also includes an electrode disposed on said semiconductor layer passing over said side surface. The side surface of the semiconductor layer beneath the electrode includes at least one region with an [0$\bar{1}$1] orientation and a surface with a (111) orientation.

A method of making a semiconductor device of the above-described type includes etching a III-V compound semiconductor layer from its (100) oriented major surface with a mask including at least one region with an [0$\bar{1}$1] orientation to form a step in the semiconductor layer, and depositing an electrode material on the semiconductor layer from a direction perpendicular to the major surface to form an electrode crossing the step in the semiconductor layer.

DETAILED DESCRIPTION OF THE INVENTION

Figure 1:
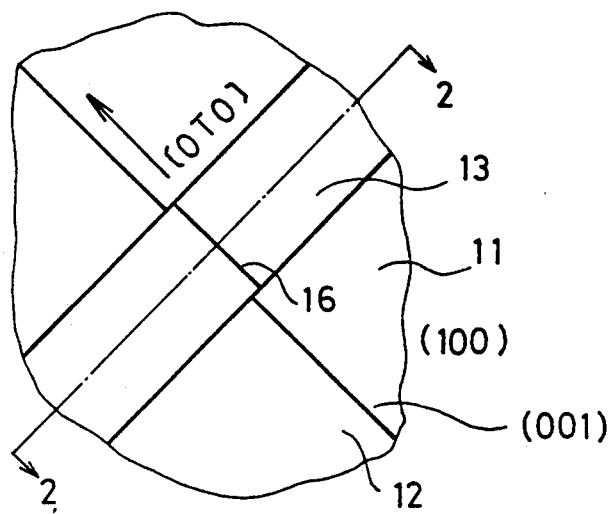
FIG. 1 is a plan view of a portion of a conventional semiconductor device.
Figure 2:
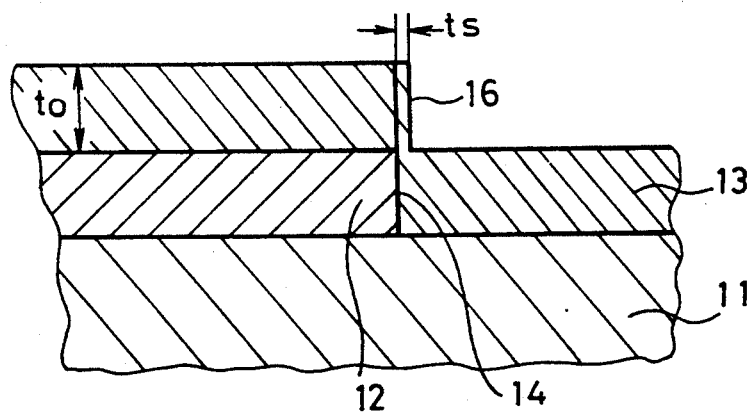
FIG. 2 is a cross-sectional view along the line 2—2 of the device shown in FIG. 1.
Figure 3:
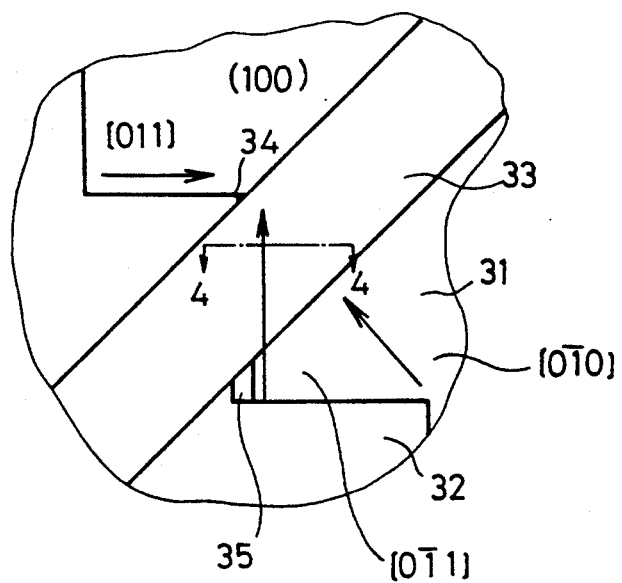
FIG. 3 is a plan view of a portion of a semiconductor device according to one embodiment of the present invention.
Figure 4:
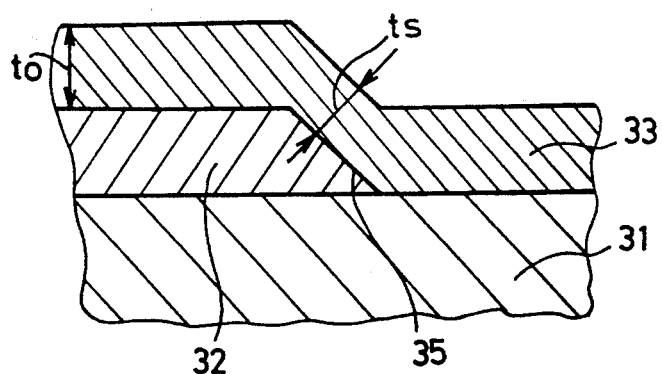
FIG. 4 is a cross-sectional view along the line 3—3 of the semiconductor device shown in FIG. 3.

FIGS. 3 and 4 show a semiconductor device according to one embodiment of the present invention. The semiconductor device includes semiconductor layers 31 and 32. Although the detail is not shown, the semiconductor layer 31 comprises a plurality of semiconductor layers, which are layers of a III-V compound semiconductor material, such as GaAs, InP and AlGaAs, with donors or acceptors added. The semiconductor layers 31 and 32 form, for example, a semiconductor laser. The upper or major surface of the semiconductor layer 31 is a (100) plane.

The semiconductor layer 32 is disposed on the semiconductor layer 31, and it also comprises a III-V compound semiconductor material, such as GaAs, InP and AlGaAs, with donors or acceptors added. The upper or major surface of the layer 32 is also a (100) plane. The semiconductor layer 32 is formed by means of epitaxial growth and etching techniques. As shown in FIG. 3, the semiconductor layer 32 has a step which extends generally along the [0$\bar{1}$0] orientation. The step includes a region 34 extending along the [011] orientation, and a region 35 which connects to the region 34 and extends in a direction perpendicular to the region 34 along the [0$\bar{1}$1] orientation. The surface of the region 35 is in the (111) plane, as shown in FIG. 4. In other words, the region 35 tapers downward toward the major surface of the semiconductor layer 31.

On the upper surfaces of the semiconductor layers 31 and 32, an electrode 33 is disposed passing over the region 35 and connecting the layers 31 and 32. For example, Al may be used as a material for the electrode 33. A vacuum vapor deposition technique may be used to form the electrode 33. The thickness $t_s$ of the portion of the electrode 33 which overlies the region 35 is as large as about 58% of the thickness $t_o$ of the portion which overlies the second semiconductor layer 32.

The semiconductor device with the above-described structure may be made in the following manner. First, the semiconductor layer 31 is prepared by a conventional technique. Then, a semiconductor layer, from which the second semiconductor layer 32 is to be formed, is epitaxially grown on the entire major surface of the semiconductor layer 31. The upper or major surface of the epitaxially grown semiconductor layer is in the (100) plane. This layer is etched to provide the semiconductor layer 32. A wet etching technique may be used, in which, for example, a solution including sulfuric acid, hydrogen peroxide and water may be used as an etchant. Before etching, a mask is disposed on the upper surface of the epitaxially grown semiconductor layer. The mask has an opening therein which is defined at least by edges corresponding to the edges of the step regions 34 and 35 shown in FIG. 3. When the above-described etchant is used to etch a III-V compound semiconductor, Group V atoms having unpaired electrons are active and react with molecules of the etchant and, accordingly, react rapidly, whereas Group III atoms having no unpaired electrons are slow to react. For example, As, which is a Group V element, reacts fast with hydrogen peroxide in the etchant and turns into arsenic oxide which is dissolved in sulfuric acid. In contrast, Ga, a Group III element, reacts slowly with hydrogen peroxide and hardly turns to gallium oxide. Accordingly, the amount of gallium dissolved into sulfuric acid is small and a quantity of gallium remains on a surface being etched. When the (100) plane major surface of the III-V compound semiconductor layer is etched with the above-described etchant, a region extending in the [0$\bar{1}$1] direction, e.g. the region 35, will have its (111) plane surface revealed. As the (111) plane has a slope of 54.7° with respect to the (100) plane, the region 35 has its surface slanting downward toward the major surface of the semiconductor layer 31 at an angle of 54.7°.

After the etching step, a suitable material is deposited onto the major surfaces of the layers 31 and 32 from above through an appropriate mask to form the electrode 33. The electrode material is deposited in a direction substantially perpendicular to the major surfaces of the layers 31 and 32. For example, vacuum vapor deposition may be used for forming the electrode 33. The thickness $t_s$ of the portion of the thus formed electrode 33 which overlies the surface of the region 35 has been calculated from the slope of the surface of the region 35 relative to the major surface of the semiconductor layer 31, and it has been known to be as large as about 58% of the thickness $t_o$ of the portion which overlies the major surface of the semiconductor layer 32.

In the above-described embodiment, the semiconductor layer 32 disposed on the semiconductor layer 31 is etched, and the electrode 33 is disposed on the layers 31 and 32. However, the major surface of the layer 31, with no semiconductor layer disposed thereon, may be etched and the electrode 33 can be disposed thereon. Furthermore, dry etching may be employed instead of wet etching.

As described in detail in the above, according to the present invention the ratio $t_s/t_o$ of the electrode 33 can be made considerably larger than could be provided by conventional techniques. Furthermore, because the orientation of the surfaces to be etched is relatively stable, a large value of $t_s$ can be obtained with high reproducibility. Thus, the probability of disconnection of conductor parts of electrodes can be completely avoided and, accordingly, high reliability can be achieved.

What is claimed is:

1. A semiconductor device comprising a III-V compound semiconductor layer having a major surface in a (100) plane of said semiconductor layer, an oblique surface having an [0$\bar{1}$1] oriented region, said oblique surface lying in a (111) plane, and an electrode disposed on said major surface of said semiconductor layer, passing over and disposed on said oblique surface.

2. A semiconductor device according to claim 1 wherein said oblique surface includes a [011] oriented region connected to said [0$\bar{1}$1] oriented region.

3. A semiconductor device according to claim 1 wherein said semiconductor layer is disposed on a second III-V compound semiconductor layer and said electrode is disposed on said second III-V compound semiconductor layer.

4. A semiconductor device according to claim 2 wherein said semiconductor layer is disposed on a second III-V compound semiconductor layer and said electrode is disposed on said second III-V compound semiconductor layer.

* * * * *